US012790228B2

(12) United States Patent
van Setten et al.

(10) Patent No.: US 12,790,228 B2
(45) Date of Patent: Nov. 10, 2026

(54) MIXED METAL OXIDES

(71) Applicant: IMEC VZW, Leuven (BE)

(72) Inventors: Michiel Jan van Setten, Heverlee (BE); Geoffrey Pourtois, Villers-la-Ville (BE); Hendrik F.W. Dekkers, Tienen (BE); Gouri Sankar Kar, Leuven (BE)

(73) Assignee: IMEC VZW, Leuven (BE)

( * ) Notice: Subject to any disclaimer, the term of this patent is extended or adjusted under 35 U.S.C. 154(b) by 491 days.

(21) Appl. No.: 18/325,823

(22) Filed: May 30, 2023

(65) Prior Publication Data

US 2023/0382758 A1 Nov. 30, 2023

(30) Foreign Application Priority Data

May 31, 2022 (EP) .................................... 22176408

(51) Int. Cl.

| | |
|---|---|
| ***C01G 9/00*** | (2006.01) |
| ***C01G 30/00*** | (2006.01) |
| ***C23C 14/08*** | (2006.01) |
| ***H10D 30/67*** | (2025.01) |
| ***H10D 99/00*** | (2025.01) |

(52) U.S. Cl.

CPC ....... *C01G 30/005* (2013.01); *H10D 30/6756* (2025.01); *C01P 2002/02* (2013.01)

(58) Field of Classification Search

CPC .... C01G 30/005; C01G 9/00; H10D 30/6756; H10D 30/6755; C01P 2002/02; C01P 2006/40; C01P 2006/80; C01P 2002/52; C01P 2002/54; C23C 14/08; C23C 14/3464; C23C 14/3485

USPC .......................................................... 423/623

See application file for complete search history.

(56) References Cited

U.S. PATENT DOCUMENTS 6,319,876 B1 * 11/2001 Maier .................. C07D 303/04 502/355
2010/0295042 A1 11/2010 Yano et al.
2012/0319113 A1 12/2012 Yamazaki
(Continued)

FOREIGN PATENT DOCUMENTS

EP 3087614 B1 2/2021
JP 2006005115 A 1/2006
(Continued)

OTHER PUBLICATIONS

European Extended Search Report, Application No. 22176406.1, dated Nov. 30, 2022, 7 pages.
(Continued)

*Primary Examiner* — Cam N. Nguyen
(74) *Attorney, Agent, or Firm* — Knobbe, Martens, Olson & Bear, LLP

(57) ABSTRACT

Mixed metal oxides and methods for making the mixed metal oxides are disclosed. A mixed metal oxide includes metal or metalloid elements including 0.50 to 0.90 parts by mole Mg, 0.05 to 0.30 parts by mole Al, 0.01 to 0.20 parts by mole Sb, and 0.00 to 0.31 parts by mole of other elements selected from metals and metalloids. The sum of all parts by mole of Mg, Al, Sb, and the other elements selected from metals and metalloids may amount to about 1.00. The mixed metal oxide additionally includes oxygen, and less than 0.01 parts by mole of non-metallic and non-metalloid impurities.

16 Claims, 2 Drawing Sheets

(56) References Cited

U.S. PATENT DOCUMENTS

| | | | |
|---|---|---|---|
| 2014/0326319 | A1 | 11/2014 | Kim et al. |
| 2015/0325707 | A1 | 11/2015 | Sano et al. |
| 2017/0012138 | A1 | 1/2017 | Suzawa et al. |
| 2017/0256676 | A1 | 9/2017 | Asadi et al. |
| 2022/0037561 | A1 | 2/2022 | Ueoka et al. |

FOREIGN PATENT DOCUMENTS

| | | | |
|---|---|---|---|
| JP | 2010028021 | A | 2/2010 |
| JP | 2013-175717 | A | 9/2013 |
| JP | 2017-022396 | A | 1/2017 |
| KR | 10-2014-0036176 | A | 3/2014 |

OTHER PUBLICATIONS

De Jamblinne De Meux, A et al., "Method to quantify the delocalization of electronic states in amorphous semiconductors and its application to assessing charge carrier mobility of p-type amorphous oxide semiconductors", Physical Review B 97 (2018) 045208, 10 pages.

Extended European Search Report dated Dec. 23, 2022 in European Application No. 22176408.7, in 11 pages.

* cited by examiner

MIXED METAL OXIDES

CROSS-REFERENCE TO RELATED APPLICATIONS

This application claims foreign priority to European Application No. 22176408.7, filed May 31, 2022, the content of which is incorporated by reference herein in its entirety.

BACKGROUND

Technological Field

The disclosed technology generally relates to mixed metal oxides, and more in particular to mixed metal oxides for thin-film transistors (TFT).

Description of the Related Technology

Thin film transistors are widely used in displays, memory, and logic devices. Due to their possibly intensive long-term use, TFTs typically comprise chemically stable materials. In particular, the material for the channel of a TFT is typically chosen to enable high on currents and low off currents, that is, a high current in the on-state and a low current in the off-state.

Some processes for forming TFTs are often in the back-end-of-line (BEOL) stage of integrated circuit fabrication. Furthermore, in the particular application of three-dimensional (3D) devices, such as 3D memory devices, devices comprising transistors (for example, thin film transistors) may be stacked so as to form the 3D device. In the process of forming a new device such as a memory cell above an existing one, temperatures above 400° C. are usually avoided so as not to substantially alter any already formed devices. However, such a limitation on deposition temperatures can severely limit the type of materials that may be deposited for fabricating TFTs. Many materials typically used as channel material may crystallize at higher crystallization temperatures, which may render them less attractive for use in TFTs.

In contrast, the deposition of amorphous materials may be formed at temperatures lower than these high thermal treatment temperatures. However, the resulting films of amorphous materials can be associated with significantly lower charge carrier mobilities than their crystalline counterparts. Moreover, to be compatible with silicon technology, the materials are preferably chemically stable during a forming gas annealing process. Amorphous materials may be less stable, for example, less chemically stable than their crystalline counterparts.

One amorphous oxide known in the industry, the metal oxide a-$InGaZnO_4$, (referred to herein as IGZO) has comparatively good electron mobility versus typical amorphous oxides. Without being bound to a single theory of operation, this relatively good electron mobility may be due to the interaction of s and d orbitals of the metal cations in a lower part of the conduction band. The strength of the bonds between the cations, and, in addition, the type of cations, may drive the effective mobility of the system. The electron mobility of a-$InGaZnO_4$ and its chemical stability may still, however, not be sufficiently high. a-$InGaZnO_4$ has relatively low electron mobility (approximately 20 to 35 cm 2/(Vs)) and low chemical stability.

There is therefore a need in the art for a material and method for forming the material that solves one or more of the above problems.

SUMMARY OF CERTAIN INVENTIVE ASPECTS

It is an object of the disclosed technology to provide a first mixed metal oxide, which comprises Mg, Al, and Sb. The disclosed technology also provides a method for forming the first mixed metal oxide, and a transistor comprising the first mixed metal oxide. The first mixed metal oxide referred to herein describes a first type of mixed metal oxide and does not require the presence of a "second metal oxide." The first mixed metal oxide may alternatively be referred to herein as "a" or "the" first mixed metal oxide, and unless specifically described otherwise, may refer to a non-specific embodiment of a first mixed metal oxide, as compared to a particular first mixed metal oxide including the features of a prior embodiment.

It is still a further object of the disclosed technology to provide a good transistor comprising a channel layer made of a second mixed metal oxide, where the second mixed metal oxide comprises Al and Zn. The second mixed metal oxide may be an amorphous mixed metal oxide. The disclosed technology also provides a method for forming the transistor including a channel layer, the channel layer including the amorphous second mixed metal oxide. The second mixed metal oxide referred to herein describes a second type of mixed metal oxide and does not require the presence of a "first metal oxide." The second mixed metal oxide may alternatively be referred to herein as "a" or "the" second mixed metal oxide, and unless specifically described otherwise, may refer to a non-specific embodiment of a second mixed metal oxide, as compared to a particular second mixed metal oxide including the features of a prior embodiment.

The disclosed technology provides several advantages, such as mixed metal oxides (for example, the first mixed metal oxide, and the second mixed metal oxide) with good electron mobility. The disclosed technology may also provide a channel of a transistor comprising one or more of these mixed metal oxides, that exhibits a high current in the on-state, and a low current in the off state.

The disclosed technology provides for a mixed metal oxide with favourable chemical stability. The disclosed technology provides for mixed metal oxides with stability against annealing in a forming gas atmosphere. This property of stability may increase the compatibility of the mixed metal oxides with a step that is often performed in semiconductor manufacturing processes.

According to the disclosed technology, the elements making up a mixed metal oxide may be compatible with standard industrial silicon technology.

Similarly, the disclosed technology provides for mixed metal oxides that may have good properties for use of the mixed metal oxides in transistors, such as in TFTs. In some embodiments, a mixed metal oxide may have good properties for use as channel material.

According to the disclosed technology, a mixed metal oxide may be deposited at temperatures below 400° C. It is an advantage of embodiments of the disclosed technology that the mixed metal oxides may be deposited in BEOL stage of semiconductor manufacturing processing. By way of a non-limiting example, silicon devices, such as silicon logic gates, may degrade at temperatures above 400° C., and a mixed metal oxide according to the disclosed technology may be deposited at or below 400° C. The disclosed technology may provide for stacking of memory cells comprising transistors, such as TFTs, comprising one of the mixed metal oxides. In some embodiments, any already formed memory cells may not be substantially altered when forming a memory cell on top of the already formed memory cells.

In a first aspect, the disclosed technology relates to a first mixed metal oxide including: a) metal or metalloid elements comprising about 0.50 to 0.90 parts by mole Mg, 0.05 to 0.30 parts by mole Al, 0.01 to 0.20 parts by mole Sb, and 0.00 to 0.31 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00, b) oxygen, and c) less than about 0.01 parts by mole of non-metallic and non-metalloid impurities.

In some embodiments, a first mixed metal oxide may consist essentially of the above recited elements. In some embodiments, a first mixed metal oxide may consist of the above recited elements. In some embodiments, the first mixed metal oxide may comprise metal or metalloid elements, and the metal or metalloid elements may consist essentially of a) metal or metalloid elements comprising about 0.50 to 0.90 parts by mole Mg, 0.05 to 0.30 parts by mole Al, 0.01 to 0.20 parts by mole Sb, and 0.00 to 0.31 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00, b) oxygen, and c) less than about 0.01 parts by mole of non-metallic and non-metalloid impurities In some embodiments, the parts by mole of the components of the first mixed metal oxide may be measured by Rutherford Backscattering Spectrometry. In some embodiments, the parts by mole may be measured by other non-destructive or destructive techniques. In some embodiments, the parts by mole of one analytical technique may yield similar but not identical values as measured by Rutherford Backscattering Spectrometry, and a conversion between the two measurements may be established.

In a second aspect, the disclosed technology relates to a method for forming the first mixed metal oxide. In some embodiments, the disclosed technology relates to a method for forming the first mixed metal oxide according to embodiments of the first aspect of the disclosed technology. In some embodiments, the disclosed technology relates to a method for forming the first mixed metal oxide including depositing a magnesium oxide, an aluminium oxide, an antimony oxide, and optionally one or more other oxides, other than the magnesium oxide, the aluminium oxide, and the antimony oxide, selected from metal oxides and metalloid oxides on a substrate, so as to form a first mixed metal oxide including: a) metal or metalloid elements comprising about 0.50 to 0.90 parts by mole Mg, 0.05 to 0.30 parts by mole Al, 0.01 to 0.20 parts by mole Sb, and 0.00 to 0.31 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00, b) oxygen, and c) less than about 0.01 parts by mole of non-metallic and non-metalloid impurities.

In a third aspect, the disclosed technology relates to a transistor including the first mixed metal oxide according to embodiments of the first aspect of the disclosed technology.

In a fourth aspect, the disclosed technology relates to a transistor including a channel layer, the channel layer including an amorphous second mixed metal oxide, the amorphous second mixed metal oxide including: a) metal or metalloid elements comprising about 0.25 to 0.45 parts by mole Al, 0.55 to 0.75 parts by mole Zn, and 0.00 to 0.20 parts by mole of other elements, other than Al and Zn, selected from metals and metalloids, wherein the sum of all parts by mole of Al, Zn, and the other elements, other than Al and Zn, selected from metals and metalloids amounts to about 1.00, b) oxygen, and c) less than about 0.01 parts by mole of non-metallic and non-metalloid impurities.

In a fifth aspect, the disclosed technology relates to a method for forming a transistor. In some embodiments, the disclosed technology relates to a method for forming a transistor according to embodiments of the fourth aspect of the disclosed technology, wherein forming the channel layer of said transistor includes the steps of: depositing an aluminium oxide, a zinc oxide, and optionally one or more other oxides, other than the aluminium oxide, and the zinc oxide, selected from metal oxides and metalloid oxides on a substrate, so as to form an amorphous second mixed metal oxide including: a) metal or metalloid elements comprising about 0.25 to 0.45 parts by mole Al, 0.55 to 0.75 parts by mole Zn, and 0.00 to 0.20 parts by mole of other elements, other than Al and Zn, selected from metals and metalloids, wherein the sum of all parts by mole of Al, Zn, and the other elements, other than Al and Zn, selected from metals and metalloids amounts to about 1.00, b) oxygen, and c) less than about 0.01 parts by mole of non-metallic and non-metalloid impurities.

Particular aspects of the disclosed technology are described throughout the disclosure. Features from any particular embodiment may be combined with features of other embodiments as appropriate and not merely as explicitly set out in the claims.

Although there has been constant improvement, change and evolution of devices in this field, the present concepts are believed to represent substantial new and novel improvements, including departures from prior practices, resulting in more efficient, stable and reliable devices.

The above and other characteristics, features and advantages of the disclosed technology will become apparent from the following detailed description, taken in conjunction with the accompanying drawings, which illustrate, by way of example, the principles of the disclosed technology. This description is given for the sake of example only, without limiting the scope of the disclosed technology. The reference figures and reference numbers quoted below refer to the attached drawings.

Figure 1:
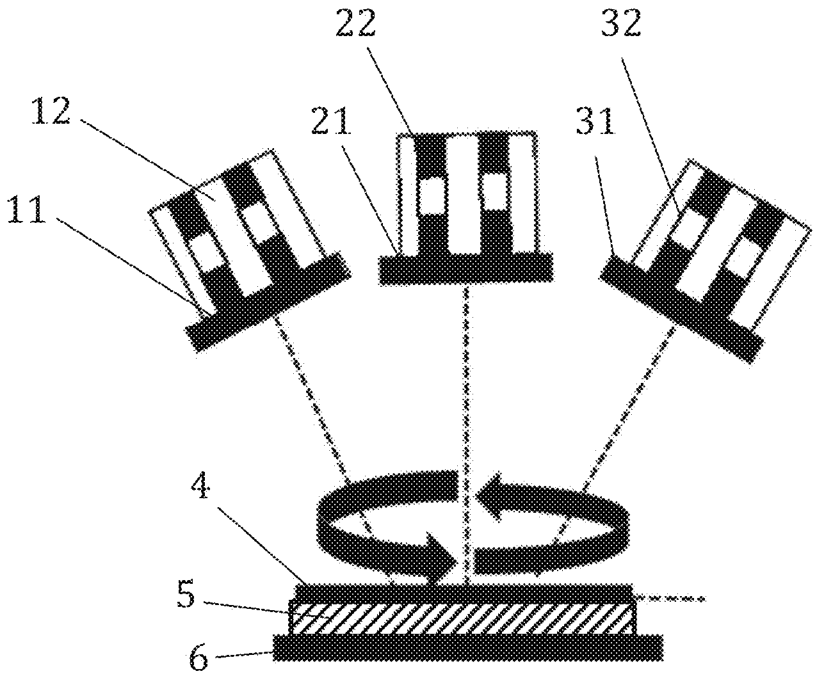
FIG. 1 is a schematic representation of a combinatorial physical vapor deposition system for performing a method in accordance with embodiments of disclosed technology.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed technology is not limited thereto. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosed technology therefore also includes as one embodiment that no further components are present. Thus, the scope of the expression "a device comprising means A and B" should not be interpreted as being limited to devices consisting only of components A and B. It means that with respect to the disclosed technology, the only relevant components of the device are A and B.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but can refer to a particular embodiment or combination of embodiments. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of describing the disclosed technology, however, is not to be interpreted as reflecting an intention that the claims require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosed technology.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Reference will be made to transistors. These are devices having a first main electrode such as a drain, a second main electrode such as a source, a channel connecting the drain and the source, and a control electrode such as a gate for controlling the flow of electrical charges between the first and second main electrodes, through the channel.

In the context of the disclosed technology, unless otherwise stated, when an amount, for example, in parts by mole, of an element is mentioned, the amount is as measured by Rutherford Backscattering Spectrometry.

In the context of the disclosed technology, a metalloid may be understood to be an element including Arsenic, Tellurium, Germanium, Silicon, Antimony, and Boron.

In a first aspect, the disclosed technology relates to a first mixed metal oxide including: a) metals and metalloids including about 0.50 to 0.90 parts by mole Mg, 0.05 to 0.30 parts by mole Al, 0.01 to 0.20 parts by mole Sb, and 0.00 to 0.31 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00, b) oxygen, and c) less than about 0.01 parts by mole of non-metallic and non-metalloid impurities. In some embodiments, parts by mole may be measured by Rutherford Backscattering Spectrometry.

The disclosed technology provides a surprising result that a first mixed metal oxide may have a combination of good electrical conductivity, and good stability. In some embodiments good stability includes good chemical stability. Without being bound by any theory, the first mixed metal oxide having the disclosed amounts of Mg, Al, and Sb according to the disclosed technology results in a conduction band that is strongly delocalized over cation sites within the first mixed metal oxide, similar to a conduction band of a-$InGaZnO_4$. This delocalization results in good electrical conductivity. Furthermore, the first mixed metal oxide of the first aspect of the disclosed technology has a preferred bandgap that is similar or slightly larger than the bandgap of a-$InGaZnO_4$. Thereby, when, for example, a first mixed metal oxide is used as a channel of a transistor, a current through the channel in an off-state of the transistor may be small. Al provides good stability to the first mixed metal oxide. Increasing the amount of Al in the first mixed metal oxide may also further increase the bandgap. An increase in the bandgap may result in a reduction in the concentration of dopants the mixed metal oxide may stably incorporate. Therefore, in some embodiments, Al may be present in an amount not larger than what is suitable to induce stability to the first mixed metal oxide. In some embodiments, the presence of Sb may reduce the bandgap of the first mixed metal oxide. In some embodiments, a reduction in the bandgap may result in an increase in the concentration of dopants the mixed metal oxide may stably incorporate. Furthermore, in some embodiments, Sb may be used to compensate the effect of Al on the bandgap, as the presence of Al may increase the bandgap. In some embodiments, increasing the amount of Sb in the first mixed metal oxide may reduce the stability of the first mixed metal oxide. Similar to a-$InGaZnO_4$, doping of the first mixed metal oxide may be induced by an oxygen deficit, compared to a stoichiometric amount of oxygen, in the first mixed metal oxide.

In some embodiments, a mixture of the first mixed metal oxide includes metals and metalloids. In some embodiments, the metals and metalloids includes about 0.63 to parts by mole Mg, 0.08 to 0.25 parts by mole Al, 0.01 to 0.15 parts by mole Sb, and 0.00 to 0.22 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00. In some embodiments, the parts by mole are as measured by Rutherford Backscattering Spectrometry. In some embodiments, a mixture of the first mixed metal oxide includes about 0.65 to 0.85 parts by mole Mg, 0.10 to 0.22 parts by mole Al, 0.01 to 0.10 parts by mole Sb, and 0.00 to parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00. In some embodiments, the parts by mole may be measured by Rutherford Backscattering Spectrometry. In some embodiments, the amount of antimony in the mixture may be from 0.01 to 0.10, may be from 0.01 to 0.08, and may be from 0.01 to 0.06, part by mole.

In some embodiments, the oxygen may be present in a first mixed metal oxide in an amount that is within 10 mol-%, preferably within 2 mol-%, such as within 1 mol-% of, most preferably equal to, a stoichiometric amount of the oxide. In some embodiments, the amount of oxygen, in moles, in a first mixed metal oxide is within 10 mol-%, preferably within 2 mol-%, such as within 1 mol-% of, most preferably equal to, the sum, in moles, of the stoichiometric amount of oxygen with respect to each metal, and possibly each metalloid, in the mixture. In other words, the combination of the mixture a) and the oxygen b) of the first mixed metal oxide includes MgO, $Al_2O_3$, and $Sb_2O_3$ and possibly one or more other stoichiometric metal oxides and/or one or more stoichiometric metalloid oxides, with a margin inclusive of 10 mol-%, preferably up to 2 mol-%, such as 1 mol-%, in the amount of oxygen. In some embodiments, oxygen is present in an amount in parts per mole that is within 10 mol-%, preferably within 2 mol-%, such as within 1 mol-% of, preferably equal to, the sum, in moles, of the amount of Mg, 1.5 times the amount of Al, and 1.5 times the amount of Sb. In such an embodiment, the first mixed metal oxide may additionally include oxygen due to oxides of other elements, such as metals and metalloids other than Mg, Al, and Sb. Without being bound to theory, one contemplated advantage is that the presence of oxygen according to the disclosed technology may facilitate the deposition of the mixed metal oxide at a low temperature.

In some embodiments, the amount of the other elements, other than Mg, Al, and Sb, selected from metals and metalloids in the mixture a) of the first mixed metal oxide may be from 0.00 to 0.14 parts by mole.

In some embodiments, the mixed metal oxide is in an amorphous phase. The disclosed technology may not substantially crystallize the mixed metal oxide. In general, crystallization may occur at relatively high temperatures for BEOL processing, such as temperatures above 400° C.

Preferably, the first mixed metal oxide is transparent in the visible region of the electromagnetic spectrum. The other elements selected from metals and metalloids, other than Mg, Al, and Sb, may comprise any metal or metalloid, different from Mg, Al, and Sb.

In some embodiments, the first mixed metal oxide includes less than 0.001 parts by mole of non-metallic and non-metalloid impurities. In preferred embodiments, the first mixed metal oxide includes less than 0.0005 parts by mole of each non-metallic and non-metalloid impurity. In some embodiments, a non-metallic and non-metalloid impurity includes hydrogen. Mixed metal oxides according to the disclosed technology may have high purity and thus may also have good and homogeneous electrical properties.

Any features of any embodiment of the first aspect may be independently combined with any other aspect of the disclosed technology.

In a second aspect, the disclosed technology relates to a method for forming the first mixed metal oxide according to embodiments of the first aspect of the disclosed technology, including depositing a magnesium oxide, an aluminium oxide, an antimony oxide, and optionally one or more other oxides, other than the magnesium oxide, the aluminium oxide, and the antimony oxide, selected from metal oxides and metalloid oxides on a substrate, so as to form a first mixed metal oxide including: a) metals and metalloids including 0.50 to 0.90 parts by mole Mg, 0.05 to 0.30 parts by mole Al, 0.01 to 0.20 parts by mole Sb, and 0.00 to 0.31 parts by mole of other elements, other than Mg, Al, and Sb, selected from metals and metalloids, wherein the sum of all parts by mole of Mg, Al, Sb, and the other elements, other than Mg, Al, and Sb, selected from metals and metalloids amounts to about 1.00, b) oxygen, and c) less than about 0.01 parts by mole of non-metallic and non-metalloid impurities. In some embodiments, the parts by mole are as measured by Rutherford Backscattering Spectrometry.

In some embodiments, the deposition may be performed at a temperature of at most 400° C., preferably in a temperature range of from about 200° C. to about 400° C. It is an advantage of embodiments of the disclosed technology that the first mixed metal oxide may be deposited in the BEOL stage of a manufacturing process of a semiconductor structure, and may be compatible with forming stacks of transistors, for example in the manufacturing process of 3D memory devices, without damaging other components of the semiconductor structure. In some embodiments, a substrate for depositions according to the disclosed technology includes a semiconductor device.

In some embodiments, the magnesium oxide, the aluminium oxide, the antimony oxide, and the optional one or more other oxides, other than the magnesium oxide, the aluminium oxide, and the antimony oxide, may be deposited using physical vapour deposition. In some embodiments, physical vapour deposition may result in a homogenous, uniform mixture of the oxides. Physical vapour deposition is compatible with the BEOL stage of semiconductor manufacturing, and with forming 3D memory devices. In some embodiments, a substrate may include silicon. In some embodiments, a substrate includes a monocrystalline silicon wafer.

In physical vapor deposition, a metal or metal oxide target inside a vacuum system may be used as a source for one or more elements of the mixed metal oxide. Physical sputtering may use ionized gases (such as Ar) to move material from the target to the substrate. In some embodiments, the physical vapour deposition is performed by sputtering using a magnesium oxide target, an aluminium target, and an antimony oxide target. The deposition may be performed by sequentially sputtering or co-sputtering the different targets. In some embodiments, a first AC potential field is applied to the magnesium oxide target, an AC potential field is applied to the antimony oxide target and a DC potential field is applied to the aluminium target. In preferred embodiments, the DC potential field applied to the aluminium target is a pulsed DC potential field. In some embodiments, the deposition of the first metal oxide may be surprisingly efficient. When other elements, other than the magnesium oxide, the aluminium oxide, and the antimony oxide, selected from metal and metalloids are present in the mixture, the deposition of the oxides of these other elements may be performed by sputtering using a corresponding metal or metalloid target or using a corresponding metal oxide or metalloid oxide target.

Any features of any embodiment of the second aspect may be independently as correspondingly described for any embodiment of the first or third aspect of the disclosed technology.

In a third aspect, the disclosed technology relates to a transistor comprising the first mixed metal oxide according to embodiments of the first aspect of the disclosed technology.

In some embodiments, the first mixed metal oxide according to embodiments of the first aspect forms a channel layer. It is an advantage of embodiments of the disclosed technology that a charge mobility in the on-stage of the transistor may be high. It is an advantage of embodiments of the disclosed technology that a charge mobility in the off-stage of the transistor may be low.

In some embodiments, the transistor is a thin film transistor. In some embodiments, the thin film transistor includes a first mixed metal oxide over a substrate. The mixed metal oxide may serve as a channel of the transistor. In some embodiments, the substrate may be or include glass, a silicon substrate, and a polymer substrate. In some embodiments, the thin film transistor includes a gate material, over the substrate. In some embodiments that gate material may be indium tin oxide. In some embodiments, the gate material may be over or directly on the substrate.

The substrate may comprise a semiconductor device. Preferably, the first mixed metal oxide is over the gate material, or the gate material is over the first mixed metal oxide. The gate material is typically separated from the first mixed metal oxide by an insulator material, such as $SiO_2$, $Al_2O_3$, silicon nitride, or $HfO_2$. The first mixed metal oxide typically contacts a drain and a source electrode, which preferably comprise a metal. The process for making thin-film transistors, for example, channels of thin-film transistors, typically employs particularly low temperatures of formation. It is an advantage of embodiments of the disclosed technology that the combination of good charge mobility, low formation temperature, and chemical stability, may make the first mixed metal oxide according to embodiments of the first aspect of the disclosed technology particularly well-suited for applications in thin film transistors.

Any features of any embodiment of the third aspect may be independently combined with any of the other aspects of the disclosed technology.

In a fourth aspect, the disclosed technology relates to a transistor including a channel layer including an amorphous second mixed metal oxide including: a) metals and metalloids including about 0.25 to 0.45 parts by mole Al, 0.55 to 0.75 parts by mole Zn, and 0.00 to 0.20 parts by mole of other elements, other than Al and Zn, selected from metals and metalloids, wherein the sum of all parts by mole of Al, Zn, and the other elements, other than Al and Zn, selected from metals and metalloids amounts to about 1.00, b) oxygen, and c) less than about 0.01 parts by mole of non-metallic and non-metalloid impurities. In some embodiments, parts by mole may be as measured by Rutherford Backscattering Spectrometry.

It is an advantage of embodiments of the fourth aspect of the disclosed technology that elements making up the second mixed metal oxide may be non-toxic.

Surprisingly, the second mixed metal oxide of the disclosed technology may have a combination of good electrical conductivity, and good stability. In some embodiments, the good stability of mixed metal oxides of the disclosed technology includes good chemical stability. Without being bound by any theory, the second mixed metal oxide having the disclosed amounts of Al and Zn according to the disclosed technology results in a conduction band that is strongly delocalized over cation sites within the second mixed metal oxide, similar to a conduction band of a-$InGaZnO_4$. This delocalization results in good electrical conductivity. Furthermore, the second mixed metal oxide of the fourth aspect of the disclosed technology may include the property of a preferred bandgap that is similar or slightly larger than the bandgap of a-$InGaZnO_4$. Thereby, when, for example, the second mixed metal oxide is used as a channel of a transistor, a current through the channel in an off-state of the transistor may be small. Al may provide good stability to the second mixed metal oxide. At the same time, increasing the amount of Al in the second mixed metal oxide may further increase the bandgap. An increase in the bandgap may result in a reduction in the concentration of dopants the mixed metal oxide may stably incorporate. Therefore, in some embodiments, Al may be present in an amount not larger than what is suitable to induce stability to the second mixed metal oxide.

In some embodiments, a mixture of the second mixed metal oxide includes about 0.30 to 0.45 parts by mole Al, 0.55 to 0.70 parts by mole Zn, and 0.00 to 0.20 parts by mole of other elements, other than Al and Zn, selected from metals and metalloids, wherein the sum of all parts by mole of Al, Zn, and the other elements, other than Al and Zn, selected from metals and metalloids amounts to about 1.00. In some embodiments, the parts by mole are as measured by Rutherford Backscattering Spectrometry.

In some embodiments, the oxygen is present in the second mixed metal oxide in an amount that is within 10 mol-%, preferably within 2 mol-%, such as within 1 mol-% of, most preferably equal to, a stoichiometric amount. In some embodiments, the amount of oxygen, in moles, in the second mixed metal oxide is within 10 mol-%, preferably within 2 mol-%, such as within 1 mol-% of, most preferably equal to, the sum, in moles, of the stoichiometric amount of oxygen with respect to each metal, and possibly each metalloid, in the mixture. In other words, the combination of the mixture of metals and metalloids as described as component a), above, and the oxygen b) of the second mixed metal oxide may include ZnO, and $Al_2O_3$, and possibly one or more other stoichiometric metal oxides and/or one or more stoichiometric metalloid oxides. In some embodiments, a margin of the stoichiometric percentages includes plus or minus 10 mol-%, preferably 2 mol-%, such as 1 mol-%, in the amount of oxygen. In some embodiments, oxygen is present in an amount in parts per mole that is within 10 mol-%, preferably within 2 mol-%, such as within 1 mol-% of, preferably equal to, the sum, in moles, of the amount of Zn, and 1.5 times the amount of Al. In this embodiment, the second mixed metal oxide may additionally include oxygen due to oxides of the other elements, other than Al and Zn, selected from metals and metalloids. Without being bound to theory, one contemplated advantage is that the presence of oxygen according to the disclosed technology may facilitate deposition of the second mixed metal oxide at a low temperature.

In some embodiments, the amount of the other elements, other than Al and Zn, selected from metals and metalloids in the mixture a) of the second mixed metal oxide may be from about 0.00 to about 0.14 parts by mole.

In some embodiments, the second mixed metal oxide is in an amorphous phase. The disclosed technology may not substantially crystallize the second mixed metal oxide. In general, crystallization may occur at relatively high temperatures for BEOL processing, such as temperatures above 400° C.

Preferably, the second mixed metal oxide is transparent in the visible region of the electromagnetic spectrum. The other elements selected from metals and metalloids, other than Al and Zn, may comprise any metal or metalloid that is not Al and Zn.

In some embodiments, the second mixed metal oxide includes less than about 0.001 parts by mole of non-metallic and non-metalloid impurities. In preferred embodiments, the second mixed metal oxide includes less than 0.0005 parts by mole of each non-metallic and non-metalloid impurity. By way of a non-limiting example, a non-metallic and non-metalloid impurity might include hydrogen. Mixed metal oxides according to the disclosed technology may have high purity and thus may also have good and homogeneous electrical properties.

In some embodiments, the transistor is a thin film transistor. In some embodiments, the thin film transistor includes a first mixed metal oxide over a substrate. The mixed metal oxide may serve as a channel of the transistor. In some embodiments, the substrate may be or include glass, a silicon substrate, and a polymer substrate. In some embodiments, the thin film transistor includes a gate material, over the substrate. In some embodiments that gate material may be indium tin oxide. In some embodiments, the gate material may be over or directly on the substrate.

The gate material is typically separated from the second mixed metal oxide by an insulator material, such as $SiO_2$, $Al_2O_3$, silicon nitride, or $HfO_2$. The second mixed metal oxide typically contacts a drain and a source electrode, which preferably comprise a metal. The process for making thin-film transistors, for example, channels of thin-film transistors, typically employs particularly low temperatures of formation. The disclosed technology may provide for materials with properties including good charge mobility, low formation temperature, and chemical stability. These properties may make the second mixed metal oxide according to embodiments of the fourth aspect of the disclosed technology particularly well-suited for applications in thin film transistors.

Any features of any embodiment of the fourth aspect may be independently combined with any aspect of the disclosed technology.

In a fifth aspect, the disclosed technology relates to a method for forming the transistor according to embodiments of the fourth aspect of the disclosed technology, wherein forming the channel layer of said transistor includes the steps of: depositing an aluminium oxide, a zinc oxide, and optionally one or more other oxides, other than the aluminium oxide and the zinc oxide, selected from metal oxides and metalloid oxides on a substrate, so as to form the amorphous second mixed metal oxide including: a) metals and metalloids including about 0.25 to 0.45 parts by mole Al, 0.55 to 0.75 parts by mole Zn, and 0.00 to 0.20 parts by mole of other elements, other than Al and Zn, selected from metals and metalloids, wherein the sum of all parts by mole of Al, Zn, and the other elements, other than Al and Zn, selected from metals and metalloids amounts to about 1.00, b) oxygen, and c) less than about 0.01 parts by mole of non-metallic and non-metalloid impurities. In some embodiments, the parts by mole are as measured by Rutherford Backscattering Spectrometry.

In some embodiments, the deposition may be performed at a temperature of at most 400° C., preferably in a temperature range of from about 200° C. to about 400° C. It is an advantage of embodiments of the disclosed technology that the second mixed metal oxide may be deposited in the BEOL stage of a manufacturing process of a semiconductor structure, and may be compatible with forming stacks of transistors, for example in the manufacturing process of 3D memory devices, without damaging other components of the semiconductor structure. In some embodiments, a substrate for depositions according to the disclosed technology includes a semiconductor device.

In some embodiments, the aluminium oxide, the zinc oxide, and optionally the one or more other oxides, other than the aluminium oxide, and the zinc oxide, are deposited using physical vapour deposition. In some embodiments, physical vapour deposition may result in a homogenous, uniform mixture of the oxides. Physical vapour deposition may be compatible with the BEOL stage of semiconductor manufacturing, and with forming 3D memory devices. In some embodiments, the substrate includes silicon. In some embodiments, the substrate includes a monocrystalline silicon wafer.

In some embodiments, the physical vapour deposition is performed by sputtering using a zinc oxide target and an aluminium target. In some embodiments, a first AC potential field is applied to the zinc oxide target, and a DC potential field is applied to the aluminium target. In preferred embodiments, the DC potential field applied to the aluminium target is a pulsed DC potential field. It is an advantage of embodiments of the disclosed technology that the deposition of the second metal oxide may be efficient. When other elements, other than the aluminium oxide and the zinc oxide, selected from metal and metalloids are present in the mixture, the deposition of the oxides of these other elements may be performed by sputtering using a corresponding metal or metalloid target or using a corresponding metal oxide or metalloid oxide target.

Any features of any embodiment of the fifth aspect may be independently combined with any embodiment of the fourth aspect of the disclosed technology.

The disclosed technology will now be described by a detailed description of several embodiments of the disclosed technology. It is clear that other embodiments of the disclosed technology can be configured according to the knowledge of persons skilled in the art without departing from the technical teaching of the disclosed.

Example 1: Theoretical Calculations for a First Mixed Metal Oxide

First principles theoretical calculations, within the framework of density functional theory, for example, the Perdew-Burke-Ernzerhof (PBE) density functional theory revised for solids ("PBEsol functional"), were performed to assess the electrical properties and the stability of a range of mixed metal oxides. Herein, the electrical properties are defined by the magnitude of the bandgap, and the inverse state weighted overlap (ISWO) parameter. The ISWO parameter may define the overlap of orbitals between atoms in a material. A low ISWO value represents a delocalized molecular orbital, whose atomic orbitals are continuously connected between the different atomic sites. A high ISWO value represents a highly localized and poorly connected molecular orbital. The ISWO parameter, and how it may be calculated, is further described in A. de Jamblinne de Meux et al., Method to quantify the delocalization of electronic states in amorphous semiconductors and its application to assessing charge carrier mobility of p-type amorphous oxide semiconductors, Physical Review B 97 (2018) 045208.

In this example, calculations were performed for primary oxides, one metal and oxygen, and binary oxides, two metals and oxygen amorphous oxides. The calculations were performed for 12 metals and metalloids (Mg, Al, Si, Ti, Zn, Ga, Zr, Ag, Cd, In, Sn, and Sb). Machine learning (support vector machines) was used to develop predictor functions for oxides including up to all 12 element and oxygen. A single objective function F(x) (shown below) was developed, that, through minimalization, may be used to predict promising materials.

By varying the weights and target gap in the objective function, first mixed metal oxides including Mg, Al, and Sb as metal, were found to have very promising properties. Hereinbelow, results are shown for an amorphous first mixed metal oxide including Mg, Al, Sb, and oxygen in stoichiometric amounts relative to their respective oxides, as a function of the amount of Mg, Al, and Sb in the first mixed metal oxide. Herein, x refers to the amounts of Mg, Al, and Sb in the first mixed metal oxide.

Reference is made to Table A, which contains values for the ISWO of the conduction band of the first mixed metal oxide, as a function of the amount of Mg, Al, and Sb in the first mixed metal oxide. Herein, an ISWO of the conduction band of the first mixed metal oxide is defined with respect to an ISWO of the conduction band of a-$InGaZnO_4$, i.e., Δ-$ISWO_C=I_c(x)$. Preferably, the ISWO of the conduction band is as low as possible. A low ISWO for the conduction band may correspond to a continuous molecular orbital for the conduction band, and a potentially high charge mobility in the conduction band. A transistor channel including a material having a low ISWO for the conduction band may result in a high current through the channel in an on-state of the transistor. In some embodiments, the ISWO for the conduction band is found to increase with an increasing concentration of antimony and to decrease with an increasing concentration of Al in the first mixed metal oxide.

Reference is still made to Table A, which, furthermore, contains values for the ISWO of the valence band of the first mixed metal oxide as a function of the amount of Mg, Al, and Sb in the first mixed metal oxide. Herein, an ISWO of the valence band of the first mixed metal oxide is defined with respect to the ISWO of the valence band of a-$InGaZnO_4$, i.e., Δ-$ISWO_V=I_v(x)$. Preferably, the ISWO of the valence band is as high as possible. A high ISWO for the valence band may correspond to a discontinuous molecular orbital for the valence band, and a potentially low charge mobility in the valence band. A transistor channel including a material having a high ISWO for the valence band may result in a low current through the channel in an off-state of the transistor. In some embodiments, the ISWO for the valence band is found to increase with decreasing concentrations of Sb in the first mixed metal oxide.

Reference is still made to Table A, which, furthermore, contains values for the bandgap of the first mixed metal oxide, as a function of the amount of Mg, Al, and Sb in the first mixed metal oxide. Herein, a bandgap is defined with respect to the bandgap of a-$InGaZnO_4$, i.e., Δ-gap=G(x). Preferably, the bandgap of the first mixed metal oxide is similar to, or a bit, for example, 1 eV, higher than the bandgap of a-$InGaZnO_4$. In some embodiments, the bandgap increases with an increasing concentration of Al, and with a decreasing concentration of Sb. A transistor comprising a channel including the first mixed metal oxide, a large bandgap may indicate that the charge mobility may be low in the off state, and high in the on state of the transistor. While larger bandgaps may enable high on current/off current ratio, doping may be increasingly difficult for larger band gaps.

Reference is still made to Table A, which, furthermore, contains values for the energy of formation of the first mixed metal oxide, as a function of the amount of Mg, Al, and Sb in the mixed metal oxide. A relative energy of formation of the mixed metal oxide is provided that is the difference between: the energy of formation with respect to the energy of formation of isolated atoms of the mixed metal oxide in the gas phase; and the energy of formation with respect to the energy of formation of isolated atoms of a-$InGaZnO_4$ in the gas phase. The relative energy of formation is given as Δ-$E_{form}=E_f(x)$. Herein, a negative value means that the mixed metal oxide is calculated to be more stable than a-$InGaZnO_4$. In some embodiments, the energy of formation reduces, and, correspondingly, the stability increases, with increasing amount of Al, and decreasing amount of Sb.

TABLE A

Calculated electronic properties, and formation energies, for a range of compositions

| Metal content | Δ-gap = G(x) | Δ-$ISWO_C$ = $I_c(x)$ | Δ-$ISWO_V$ = $I_v(x)$ | Δ-$E_{form}$ = $E_f(x)$ |
|---|---|---|---|---|
| $Al_{0.16}Mg_{0.80}Sb_{0.05}$ | 0.83 | −0.06 | 5.35 | −1.52 |
| $Al_{0.17}Mg_{0.78}Sb_{0.05}$ | 0.84 | −0.09 | 5.26 | −1.53 |
| $Al_{0.16}Mg_{0.80}Sb_{0.04}$ | 0.86 | −0.12 | 5.46 | −1.55 |
| $Al_{0.17}Mg_{0.79}Sb_{0.04}$ | 0.94 | −0.26 | 5.6 | −1.6 |

TABLE A-continued

| Calculated electronic properties, and formation energies, for a range of compositions | | | | |
|---|---|---|---|---|
| Metal content | Δ-gap = G(x) | Δ-$ISWO_C$ = $I_c(x)$ | Δ-$ISWO_V$ = $I_v(x)$ | Δ-$E_{form}$ = $E_f(x)$ |
| $Al_{0.15}Mg_{0.82}Sb_{0.03}$ | 0.95 | −0.24 | 5.83 | −1.61 |
| $Al_{0.16}Mg_{0.82}Sb_{0.03}$ | 0.98 | −0.31 | 5.9 | −1.64 |
| $Al_{0.17}Mg_{0.80}Sb_{0.03}$ | 0.99 | −0.35 | 5.76 | −1.65 |
| $Al_{0.16}Mg_{0.82}Sb_{0.02}$ | 1.02 | −0.37 | 5.97 | −1.66 |
| $Al_{0.19}Mg_{0.77}Sb_{0.03}$ | 1.02 | −0.42 | 5.63 | −1.66 |
| $Al_{0.18}Mg_{0.79}Sb_{0.03}$ | 1.03 | −0.43 | 5.8 | −1.67 |
| $Al_{0.18}Mg_{0.79}Sb_{0.02}$ | 1.07 | −0.49 | 5.89 | −1.7 |
| $Al_{0.19}Mg_{0.78}Sb_{0.03}$ | 1.08 | −0.51 | 5.79 | −1.71 |
| $Al_{0.19}Mg_{0.79}Sb_{0.02}$ | 1.11 | −0.55 | 5.98 | −1.73 |

To derive an optimum with respect to each of the parameters, an objective function may be calculated according to the following formula:

$$F(x)=(G(x)-G_t)^2+AI_c(x)-BI_v(x)+CE_f(x)$$

wherein G(x)=Δ-gap, $I_C(x)$=Δ-$ISWO_C$, $I_V(x)$=Δ-$ISWO_V$, and $E_f(x)$=Δ-$E_{form}$, each as a function of composition, i.e., amount of Mg, Al, and Sb. Herein, $G_t$ is a target bandgap, and A, B, and C are weight factors. The optimum with respect to material properties may correspond to a minimum in F(x). Herein, for each of G t and weight factors A, B, and C, the following values were used: $G_t$: [0, 0.25, 0.5, 0.75, 1]; A: [0.1, 0.2]; B: [0.01, 0.02]; and C: [0.0, 0.5, 1.0, 1.5]. For all these 4×2×2×4 combinations, F(x) may be optimized. The values summarized in Table A are all unique solutions of this optimization.

A minimum in F(x) may correspond to a balance between good electrical properties and good stability. According to the present calculations, these properties compare well with, and may be better than, the corresponding properties of IGZO that is, at present, generally used in the field of thin-film transistors. Preferred embodiments of the disclosed technology correspond to first mixed metal oxides having an amount of Mg, Al, and Sb, close to a ratio providing a calculated optimum.

Similar calculations as above show that second mixed metal oxides including Al and Zn as metal have very promising properties. Hereinbelow, results are shown for an amorphous second mixed metal oxide including Al and Zn, and oxygen in a stoichiometric amount, as a function of the amount of Al and Zn in the second mixed metal oxide. Herein, x is for the amounts of Al and Zn in the second mixed metal oxide.

Reference is made to Table B, which shows results of similar calculations as above, but now for a second mixed metal oxide.

TABLE B

| Calculated electronic properties, and formation energies, for a range of compositions | | | | |
|---|---|---|---|---|
| Metal content | Δ-gap = G(x) | Δ-$ISWO_C$ = $I_c(x)$ | Δ-$ISWO_V$ = $I_v(x)$ | Δ-$E_{form}$ = $E_f(x)$ |
| $Al_{0.23}Zn_{0.77}$ | 0.44 | −0.40 | −2.36 | −0.60 |
| $Al_{0.26}Zn_{0.74}$ | 0.51 | −0.38 | −2.31 | −0.71 |
| $Al_{0.29}Zn_{0.71}$ | 0.61 | −0.34 | −2.23 | −0.85 |
| $Al_{0.31}Zn_{0.69}$ | 0.65 | −0.32 | −2.19 | −0.92 |
| $Al_{0.32}Zn_{0.68}$ | 0.67 | −0.31 | −2.17 | −0.95 |
| $Al_{0.33}Zn_{0.67}$ | 0.71 | −0.30 | −2.13 | −1.00 |

TABLE B-continued

| Calculated electronic properties, and formation energies, for a range of compositions | | | | |
|---|---|---|---|---|
| Metal content | Δ-gap = G(x) | Δ-$ISWO_C$ = $I_c(x)$ | Δ-$ISWO_V$ = $I_v(x)$ | Δ-$E_{form}$ = $E_f(x)$ |
| $Al_{0.40}Zn_{0.60}$ | 0.90 | −0.19 | −1.95 | −1.24 |
| $Al_{0.41}Zn_{0.59}$ | 0.93 | −0.17 | −1.92 | −1.28 |

An ISWO of the conduction band of the second mixed metal oxide, defined with respect to an ISWO of the conduction band of a-$InGaZnO_4$, i.e., Δ-$ISWO_C$=$I_c(x)$, increases with an increasing concentration of Al, and with a decreasing concentration of Zn. It may be observed that an ISWO of the valence band of the second mixed metal oxide, defined with respect to the ISWO of the valence band of a-$InGaZnO_4$, i.e., Δ-$ISWO_V$=$I_v(x)$, increases with an increasing concentration of Al, and with a decreasing concentration of Zn. A bandgap, defined with respect to the bandgap of a-$InGaZnO_4$, i.e., Δ-gap=G(x), increases with an increasing concentration of Al and with a decreasing concentration of Zn. A relative energy of formation $E_{form}$=$E_f(x)$ of the second mixed metal oxide, which is the difference between the energy of formation with respect to the energy of formation of isolated atoms of the mixed metal oxide in the gas phase, and the energy of formation with respect to the energy of formation of isolated atoms of a-$InGaZnO_4$ in the gas phase, may be observed to decrease with increasing concentration of Al, and with decreasing concentration of Zn.

Example 2a: Method for Forming the First Mixed Metal Oxide

Reference is made to FIG. 1, which is a schematic representation of a combinatorial physical vapour deposition system that may be used for performing a method according to embodiments of the disclosed technology. For example, a combinatorial physical vapour deposition system may be used for performing a method according to embodiments of the second aspect of the disclosed technology, to form a first mixed metal oxide according to embodiments of the first aspect of the disclosed technology. The combinatorial physical vapour deposition system of this example may deposit oxides, such as MgO, $Al_2O_3$, and $Sb_2O_3$. For the deposition shown in the example, three sputter targets 11, 21, and 31 are mounted, each on an individual cathode 12, 22, and 32, respectively. Each of the sputter targets 11, 21 and 31 is aimed towards a substrate 5. In this example, the substrate 5 is a 300 mm wide Si wafer. Heating of the substrate 5 may be performed by clamping the substrate 5 to an electrically heated rotating chuck 6. The deposition is typically performed in an Ar atmosphere, although also other gases may be used. Ar may be ionized and accelerated towards each of the targets 11, 21, and 31, by application of a potential to each of the corresponding cathodes 12, 22, and 32. The impact of the Ar ions on a target 11, 21, or 31 induces release of atoms or atom clusters from the target 11, 21, or 31. This process is referred to as 'sputtering'.

Depending on the conductance of the target 11, 21 or 31, the potential applied to the cathode 12, 22, or 32 may be oscillated. When the target 11, 21, or 31 comprises an oxide material, for example, MgO, $Al_2O_3$, or $Sb_2O_3$, the applied potential may oscillate at a frequency inside the radio frequency domain. When the target 11, 21, or 31 is an elemental target, for example, Mg or Al, a DC potential may be applied. In this example, a MgO target 11 and a $Sb_2O_3$ target 21 are powered with an oscillating potential, and an elemental Al target 31 is powered with a pulsed DC potential. To obtain a fully oxidized material with elemental targets, $O_2$ may be added to the sputtering gas. The $O_2$ gas may oxidize the target during the sputtering process, thereby forming an insulating top layer on the target. In that case, a pulsed DC potential may be preferably used. Pressure is regulated by the total flow, that is Ar flow and $O_2$ flow, and is typically in the range of a few Pascals. In some embodiments, the pressure may be in the range of about 1 to about 10 Pa.

In some embodiments, a uniform deposition, such as a uniform first mixed metal oxide 4, may be achieved by optimization of the aiming angle of the cathodes 12, 22, and 32, and by rotation of the substrate 5 at a high rate. Typically, a deposition rate is low enough to facilitate random mixing of the elements during deposition. Thereby, the deposition may result in a uniform film of the first mixed metal oxide 4. The composition of the film 4, for example, the amounts of Sb, Mg, and Al in the mixed metal oxide 4, may be regulated by adjusting the potential that is applied to each cathode 12, 22, and 32.

Example 2b: Method for Forming the Second Mixed Metal Oxide

Figure 2:
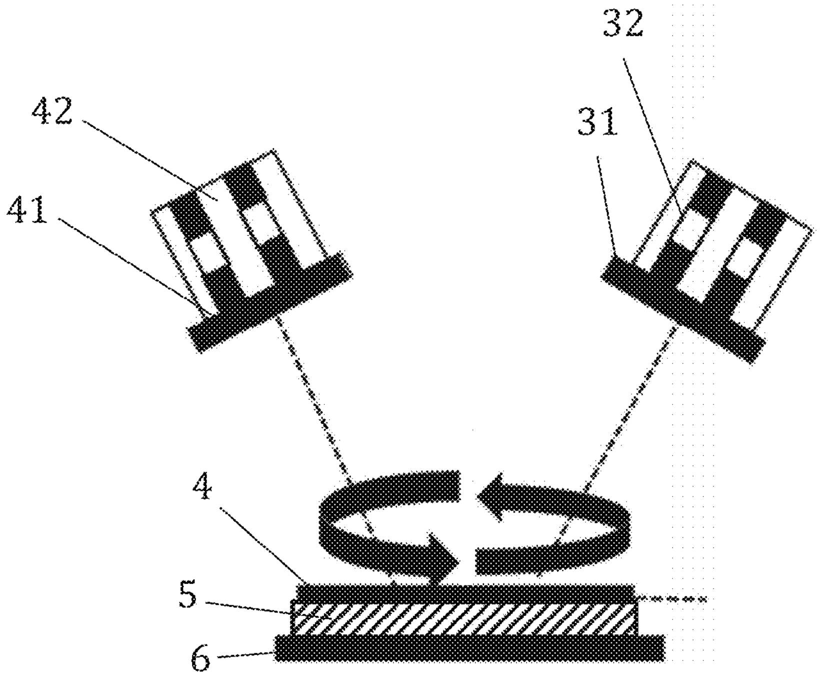
FIG. 2 is a schematic representation of a combinatorial physical vapor deposition system for performing a method in accordance with embodiments of the disclosed technology.

Reference is made to FIG. 2, which is a schematic representation of a combinatorial physical vapour deposition system that may be used for performing a method according to embodiments of the fifth aspect of the disclosed technology, to form a second mixed metal oxide according to embodiments of the fourth aspect of the disclosed technology. The combinatorial physical vapour deposition system of this example may deposit oxides, for example, $Al_2O_3$, and ZnO. For the deposition, in the example, two sputter targets 31 and 41 are mounted, each on an individual cathode 32 and 42. Each of the sputter targets 31 and 41 is aimed towards a substrate 5. In this example, the substrate 5 is a 300 mm wide Si wafer. Heating of the substrate 5 may be enabled by clamping the substrate 5 to an electrically heated rotating chuck 6. The deposition is typically performed in an Ar atmosphere, although also other gases may be used. Ar may be ionized and accelerated towards each of the targets 31 and 41, by application of a potential to each of the corresponding cathodes 32 and 42. The impact of the Ar ions on a target 31 and 41 induces release of atoms or atom clusters from the target 31 and 41. This process is referred to as "sputtering".

Depending on the conductance of the target 31 and 41, the potential applied to the cathode 32 and 42 may be oscillated. When the target 31 or 41 comprises an oxide material, for example, ZnO or $Al_2O_3$, the applied potential may oscillate at a frequency inside the radio frequency domain. When the target 31 or 41 is an elemental target, for example, Al, a DC potential may be applied. In this example, a ZnO target 41 is powered with an oscillating potential, and an elemental Al target 31 is powered with a pulsed DC potential. To obtain a fully oxidized material with elemental targets, $O_2$ may be added to the sputtering gas. The $O_2$ gas may oxidize the target during the sputtering process, thereby forming an insulating top layer on the target. In that case, a pulsed DC potential is preferably used. Pressure is regulated by the total flow, i.e., Ar flow and $O_2$ flow, and is typically in the range of a few, for example, 1 to 10 Pa.

In some embodiments, a uniform deposition, such as a uniform second mixed metal oxide 7, may be achieved by optimization of the aiming angle of the cathodes 32 and 42, and by rotation of the substrate 5 at a high rate. Typically, a deposition rate is low enough to facilitate random mixing of the elements during deposition. Thereby, the deposition may result in a uniform film of the second mixed metal oxide 7. The composition of the film 7, for example, the amounts of Zn and Al in the second mixed metal oxide 7, may be regulated by adjusting the potential that is applied to each cathode 32 and 42.

It is to be understood that although preferred embodiments, specific constructions and configurations, as well as materials, have been discussed herein for devices according to the disclosed technology, various changes or modifications in form and detail may be made without departing from the scope of this disclosed technology. Steps may be added or deleted to methods described within the scope of the disclosed technology.

What is claimed is:

1. A mixed metal oxide comprising:

metal or metalloid elements comprising 0.50 to 0.90 parts by mole Mg, 0.05 to 0.30 parts by mole Al, 0.01 to 0.20 parts by mole Sb, and 0.00 to 0.31 parts by mole of other elements selected from metals and metalloids, wherein a sum of all parts by mole of Mg, Al, Sb, and the other elements selected from metals and metalloids amounts to about 1.00;

oxygen; and less than 0.01 parts by mole of non-metallic and non-metalloid impurities relative to the total moles of the mixed metal oxide.

2. The mixed metal oxide according to claim 1, wherein the parts by mole are as measured by Rutherford Backscattering Spectrometry.

3. The mixed metal oxide according to claim 1, wherein the metal or metalloid elements comprise:

0.63 to 0.85 parts by mole Mg, 0.08 to 0.25 parts by mole Al, 0.01 to 0.15 parts by mole Sb, and 0.00 to 0.18 parts by mole of the other elements, selected from metals and metalloids, wherein the sum of all parts by mole of Mg, Al, Sb, and the other elements selected from metals and metalloids amounts to 1.00.

4. The mixed metal oxide according to claim 1, wherein the oxygen is present in an amount that is within 10 mol-% of a stoichiometric amount of the oxide.

5. The mixed metal oxide according to claim 1, wherein the metal and metalloid elements comprise 0.00 to 0.14 parts by mole of the other elements selected from metals and metalloids.

6. The mixed metal oxide according to claim 1, wherein the mixed metal oxide is in an amorphous phase.

7. A transistor comprising the mixed metal oxide of claim 1.

8. The transistor according to claim 7, wherein the mixed metal oxide forms a channel layer.

9. The transistor according to claim 7, wherein the transistor is a thin film transistor.

10. A method of forming a mixed metal oxide, the method comprising:

depositing a magnesium oxide, an aluminum oxide, an antimony oxide, on a substrate, to form the mixed metal oxide, the mixed metal oxide comprising:

metal or metalloid elements comprising 0.50 to 0.90 parts by mole Mg, 0.05 to 0.30 parts by mole Al, 0.01 to 0.20 parts by mole Sb, and 0.00 to 0.31 parts by mole of other elements selected from metals and metalloids, wherein a sum of all parts by mole of Mg, Al, Sb, and the other elements selected from metals and metalloids amounts to about 1.00;

oxygen; and less than 0.01 parts by mole of non-metallic and non-metalloid impurities relative to the total moles of the mixed metal oxide.

11. The method according to claim 10, wherein the magnesium oxide, the aluminum oxide and the antimony oxide are deposited using physical vapor deposition.

12. The method according to claim 10, wherein the parts by mole are as measured by Rutherford Backscattering Spectrometry.

13. The method according to claim 10, further comprising depositing one or more other oxides selected from metal oxides and metalloid oxides other than the magnesium oxide, the aluminum oxide and the antimony oxide.

14. The method according to claim 10, wherein depositing is performed at a temperature of at most 400° C.

15. The method according to claim 10, wherein depositing is performed at a temperature range of 200° C. to 400° C.

16. The method according to claim 10, wherein the mixed metal oxide forms a channel of a transistor.

* * * * *